US009843266B2

United States Patent
Alahuhtala et al.

(10) Patent No.: US 9,843,266 B2
(45) Date of Patent: Dec. 12, 2017

(54) METHOD FOR DAMPING RESONANT COMPONENT OF COMMON-MODE CURRENT OF MULTI-PHASE POWER CONVERTER

(71) Applicant: ABB Technology AG, Zürich (CH)

(72) Inventors: Jarno Alahuhtala, Espoo (FI); Tomi Riipinen, Järvenpää (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/972,190

(22) Filed: Dec. 17, 2015

(65) Prior Publication Data

US 2016/0181938 A1    Jun. 23, 2016

(30) Foreign Application Priority Data

Dec. 19, 2014  (EP) ..................... 14199291

(51) Int. Cl.
| | | |
|---|---|---|
| *H02M 1/12* | (2006.01) | |
| *H02M 5/297* | (2006.01) | |
| *H02M 7/487* | (2007.01) | |
| *H03H 7/01* | (2006.01) | |

(52) U.S. Cl.
CPC .............. *H02M 5/297* (2013.01); *H02M 1/12* (2013.01); *H02M 7/487* (2013.01); *H03H 7/0161* (2013.01)

(58) Field of Classification Search
None
See application file for complete search history.

(56) References Cited

U.S. PATENT DOCUMENTS

| | | | |
|---|---|---|---|
| 2005/0063202 A1 | 3/2005 | Stancu et al. | |
| 2007/0007929 A1* | 1/2007 | Lee ................ | H02M 7/53875 318/802 |
| 2007/0296374 A1* | 12/2007 | Baudesson ........ | H02M 1/126 318/772 |

(Continued)

FOREIGN PATENT DOCUMENTS

| | | |
|---|---|---|
| EP | 2375552 A1 | 4/2010 |
| EP | 2672621 A1 | 6/2012 |
| WO | 2014/048471 A1 | 4/2014 |

OTHER PUBLICATIONS

European Patent Office, European Search Report issued in European Patent Application No. 14199291 dated May 28, 2015, 2 pp.

(Continued)

*Primary Examiner* — Jeffrey Gblende
(74) *Attorney, Agent, or Firm* — Taft Stettinius & Hollister LLP

(57) ABSTRACT

The present disclosure describes a method and arrangement for damping a resonant component of a common-mode current of a multi-phase power converter comprising an output filter with a virtual ground connection to the power converter. In the method and arrangement, the common-mode current is determined, a feedback signal is formed on the basis of the common-mode current, and the feedback signal is injected into a common mode current reference in order to dampen the resonance frequency component. A delay is added to the feedback signal so that the feedback signal has a sufficient phase margin with respect to a subsequent cycle of the resonance frequency component of the common-mode current.

20 Claims, 2 Drawing Sheets

(56) References Cited

U.S. PATENT DOCUMENTS

| | | | |
|---|---|---|---|
| 2010/0080028 A1* | 4/2010 | Cheng | H02M 5/4585 363/126 |
| 2011/0089693 A1* | 4/2011 | Nasiri | F03D 7/0272 290/44 |
| 2011/0130889 A1* | 6/2011 | Khajehoddin | H02J 3/383 700/298 |
| 2013/0099571 A1 | 4/2013 | Bremicker et al. | |
| 2014/0048471 A1 | 2/2014 | Gaignet et al. | |

OTHER PUBLICATIONS

Papavasiliou, et al., Current Control of a Voltage Source Inverter Connected to the Grid via LCL Filter, Power Electronics Specialists Conference 2007, pp. 2379-2384, Jun. 17, 2007, IEEE, Piscataway, NJ, USA.

* cited by examiner

METHOD FOR DAMPING RESONANT COMPONENT OF COMMON-MODE CURRENT OF MULTI-PHASE POWER CONVERTER

FIELD

The present disclosure relates to power converters with virtual ground connections, and particularly to damping a common-mode resonance in the virtual ground connection.

BACKGROUND INFORMATION

A power converter in the context of the present disclosure typically comprises an inverter. An inverter may comprise semiconductor switches configured into an inverter bridge. The inverter generates output voltages or currents by modulating the semiconductor switches into a conducting or non-conducting state.

A power converter may be coupled with an output filter in order to improve the quality of the power produced by the power converter. The filter may be an LC or an LCL filter, for example. In some applications, the LCL filter may have a direct connection from the star point of capacitors of the filter to a DC bus of the power converter. In the present disclosure, such a configuration is called a power converter with virtual ground (VG) connection. The virtual ground connection may be used for limiting high frequency fluctuation of the inverter DC bus with respect to a ground potential.

Part of the output filter may form a common-mode resonance (CMR) circuit that carries a circulating resonance current on the virtual ground connection. For example, if a power converter comprises a high-performance (i.e. low-loss) LCL filter with a virtual ground connection, a strong resonance may arise via a common-mode LC circuit as the natural damping of the circuit (i.e. losses at a resonance frequency) may be very low due to the use of high-performance, low-loss materials. Even when a common-mode voltage control reference of the inverter does not excite the common-mode resonance, a wide dispersing spectrum of the common-mode voltage (due to inverter modulation) may give rise to this resonance at almost every operating point of the inverter.

Mitigating the common-mode voltage effects at the resonance frequency may be desirable since a common-mode resonance may cause additional losses and performance degradation of the inverter (e.g. degradation in efficiency, EMC and grid current control performance). For example, adverse effects of the CMR may be present in photovoltaic (PV) inverters where the CMR may cause increased leakage currents via PV modules' stray capacitances. The leakage current may have certain limit values that are dictated by standards and, therefore, minimizing any additional high-frequency content on the inverter DC bus may be desirable.

Adverse effects of the resonant component of the common-mode voltage may be reduced by using passive or active damping methods, for example. Passive common-mode damping may be implemented with auxiliary circuitry such as resistive components mitigating the common-mode component, for example. However, such additional components may increase the cost of the system and reduce its performance. Active common-mode damping methods may also require the use of additional sensors and/or may not operate as intended under non-ideal operating conditions.

BRIEF DISCLOSURE

An object of the present invention is to provide a method and an apparatus for implementing the method so as to alleviate the above disadvantages. The objects of the invention are achieved by a method and an arrangement which are characterized by what is stated in the independent claims. The preferred embodiments of the invention are disclosed in the dependent claims.

The present disclosure describes a method for damping a resonant component of a common-mode current of a multi-phase power converter, where the converter comprises an output filter with a virtual ground connection to the power converter, and where a common-mode component of the converter is controlled on the basis of a common-mode component reference.

In the method, a common-mode current is determined by estimating or measuring, for example. A frequency component of the common-mode current at the resonance frequency of the virtual ground resonant circuit may then be determined by using a band-pass filter, for example.

The determined resonance frequency component may be assumed to be a (sinusoidal) periodical signal. Therefore, samples of the signal sampled a full period apart may be considered indistinguishable from each other. In other words, samples with a 360° (=2π) phase shift between each other have (approximately) the same values.

Thus, a stable feedback loop may be formed by delaying the determined frequency component such that its phase shift is essentially 360° with respect to the actual common-mode current. Other delays in the feedback loop, such as A/D conversion delays of the current measurement and/or switching delays of the modulation of the power converter, may be taken into account when determining the desired delay to be induced to the measured/estimated resonance frequency component.

With the filtered and delayed feedback signal, the resonance frequency component of the common-mode current can be reliably damped. The feedback signal may be in the form of an opposite voltage reference that is injected to a common-mode voltage reference, for example.

A method according to the present disclosure enables attenuation in the vicinity of the resonance frequency without increasing common-mode current components of the virtual grounding above the resonance frequency.

An active damping method according to the present disclosure may be implemented so that it is only dependent and based on the parameters of the output filter and has no dependencies on the AC output frequency. The method may therefore easily also be adopted in an application where the AC frequency varies (e.g. a motor drive).

With a method according to the present disclosure, a common-mode resonance can be damped without additional circuitry or measurements.

BRIEF DESCRIPTION OF THE DRAWINGS

In the following the invention will be described in greater detail by means of preferred embodiments with reference to the attached drawings, in which.

DETAILED DISCLOSURE

The present disclosure describes a method for damping a resonant component of a common-mode current of a multi-phase (e.g. three-phase) power converter comprising an output filter with a virtual ground connection to the power converter. The power converter may be an inverter or a frequency converter, for example. The common-mode current flows through the virtual ground connection and may be controlled on the basis of a common-mode current reference. The common-mode current reference may be used for controlling the third-harmonic content of the produced output power, for example. The output filter may comprise at least one inductive component and at least one capacitive component that form a resonant circuit along the virtual ground connection. The output filter may be an LC filter or an LCL filter connecting the power converter to a power grid, for example.

Figure 1:
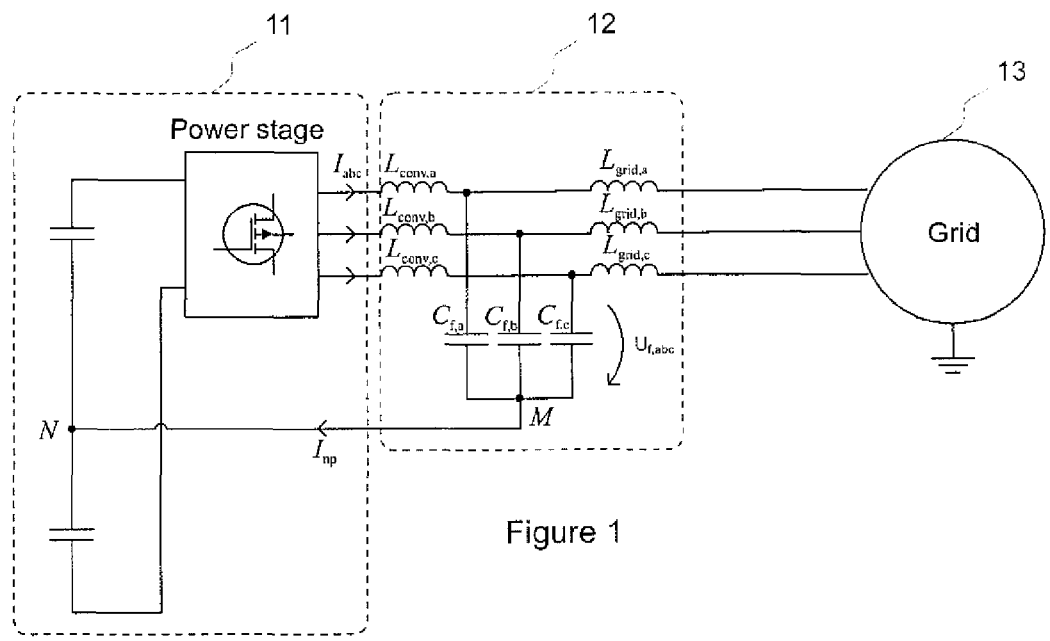
FIG. 1 shows an exemplary three-phase line converter with a virtual-ground LCL configuration.

FIG. 1 shows an exemplary three-phase line converter with a virtual-ground LCL configuration. In FIG. 1, the converter is a grid-connected, three-phase frequency converter 11 comprising an inverter bridge. An LCL filter 12 acting as the output filter is connected between the frequency converter 11 and a grid 13.

In FIG. 1, the LCL filter 12 comprises three converter-side phase inductors $L_{conv,a}$ to $L_{conv,c}$, three grid-side inductors $L_{grid,a}$ to $L_{grid,c}$, and three phase capacitors $C_{f,a}$ to $C_{f,c}$. The capacitors $C_{f,a}$ to $C_{f,c}$ are all connected to a common start point M. A virtual ground connection 14 connects the star point M of the LCL filter 12 to the neutral point N of the DC link of the frequency converter 11. A common-mode current $I_{np}$ flows between the star point M and the neutral point N in FIG. 1.

The converter-side phase inductors $L_{conv,a}$ to $L_{conv,c}$, together with the phase capacitors $C_{f,a}$ to $C_{f,c}$, form a resonant circuit via the virtual ground connection. As a result, the common-mode current may comprise a resonance frequency component induced by the resonant circuit.

Figure 2:
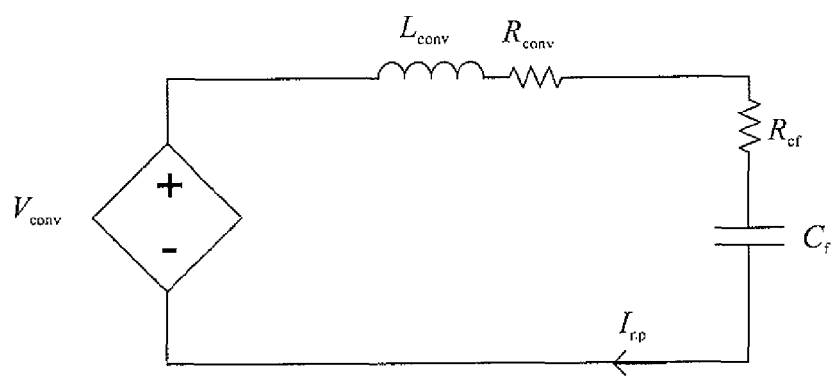
FIG. 2 shows a single-phase equivalent circuit representation of the resonant circuit of the exemplary configuration of FIG. 1.

FIG. 2 shows a single-phase equivalent circuit representation of the resonant circuit of the exemplary configuration of FIG. 1. The converter-side phase inductors $L_{conv,a}$ to $L_{conv,c}$ are represented by a single inductor $L_{conv}$ and the phase capacitors $C_{f,a}$ to $C_{f,c}$ are represented by a single capacitor $C_f$. The frequency converter is represented by a controllable voltage source $V_{conv}$. The internal resistances of the inductors and capacitors of the resonant circuit are represented by resistors $R_{conv}$ and $R_{cf}$ in FIG. 2. A common-mode current $I_{np}$ flows through the circuit of FIG. 2.

On the basis of the single-phase equivalent diagram in FIG. 2, a transfer function $G_{lc}(s)$ for a virtual ground current may be written as follows:

$$G_{lc}(s) = \frac{I_{np}(s)}{V_{conv}(s)} = \frac{Cs}{LCs^2 + RCs + 1}. \tag{1}$$

A method according to the present disclosure comprises determining the common-mode current, forming a feedback signal on the basis of the common-mode current, and injecting the feedback signal into the common-mode current reference in order to dampen the resonance frequency component. The feedback signal represents a sinusoidal resonance frequency component of the common-mode current.

By injecting the common-mode current reference with a component that is opposite the resonance frequency component, the resonance can be reduced. The common-mode current may be determined from phase currents or measured directly from the virtual ground connection, for example.

In order to ensure that damping is active only in a desired frequency range, it may be desirable to filter of the feedback signal. For example, the control system of the power converter may involve injecting a third-harmonic component into the control output power. In order to avoid disturbing the third-harmonic injection, limiting the damping only to the resonance frequency and neglecting the other frequencies may be desirable. Therefore, the sinusoidal resonance frequency component in a method according to the present disclosure may be determined with a band-pass filter having its pass-band coinciding with a resonance frequency of the resonant circuit. The band-pass filter may be a second-degree Butterworth filter, for example. A Butterworth filter has a linear phase shift, so it is well suited for a method according to the present disclosure.

The double poles in the resonance frequency of the common-mode current circuit produce a phase shift which may make controlling frequencies above the resonance frequency difficult. However, if the magnitude of a periodical signal changes relatively slowly, consecutive periods of the signal can be considered indistinguishable from each other. Thus, classical stability criteria can be fulfilled by adding a delay that creates a sufficient phase margin with respect to a subsequent period of the resonance frequency component. For example, a stable feedback loop may be formed by delaying the determined frequency component such that its phase shift is essentially 360° with respect to the original signal to be controlled.

Therefore, forming of the feedback signal in a method according to the present disclosure may comprise adding a delay to the feedback signal. The delay may be such that the determined resonance frequency component has a sufficient phase margin with respect to a subsequent cycle of the sinusoidal resonance frequency component of the common-mode current in order to form a stable control loop.

In a method according to the present disclosure, (at least) a first period of a resonance is not damped. However, since the magnitude of the resonance in practice rises gradually from zero, a method according to the present disclosure is able to efficiently dampen the resonance.

In a discrete system, various delays induced by measurements (e.g. A/D conversion) and/or pulse width modulation may have a significant effect on the control system. In order to calculate a suitable delay to be added, determining (or at least approximating) various inherent system delays may be desirable. A value for the delay added to the feedback signal may be calculated on the basis of at a least switching delay, phase shift of the output filter at the resonance frequency, and an A/D conversion delay, for example. A delay $D(s)$ involved in the system may be modelled with a first-order Páde approximation, for example:

$$D(s) = \frac{1 - \frac{T_s}{4}}{1 + \frac{T_s}{4}}, \tag{2}$$

where $T_s$ represents a sampling and/or a switching frequency in the system.

Classical control stability criteria for a gain margin may set limits to the gain of the feedback loop. Further, a modulation index of the power converter may set limitations to the gain.

Figure 3:
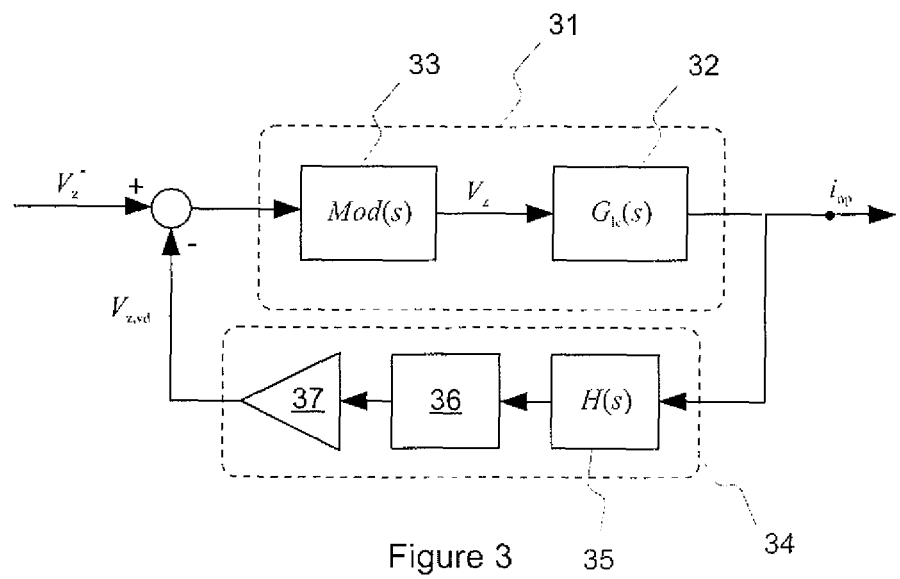
FIG. 3 shows an exemplary, simplified block diagram of an implementation of a feedback loop according to the present disclosure.

FIG. 3 shows an exemplary, simplified block diagram of an implementation of a feedback loop according to the present disclosure. In FIG. 3, the power converter system 31 produces a common-mode current $i_{np}$ on the basis of a common-mode voltage reference $V^*_z$. The power converter system may be a three-phase frequency converter coupled with a LCL output filter, for example.

In the power converter system 31, a virtual ground current block 32 implementing Equation (1) is coupled with a first delay block 33. The first delay block 33 has a transfer function Mod(s) which represents a sum of various delays involved in the system.

In FIG. 3, a feedback signal $V_{z,vd}$ is formed on the basis of the common-mode current $i_{np}$ by using a feedback means 34. The feedback signal $V_{z,vd}$ is injected into the common-mode current reference $V^*_z$ to mitigate the common-mode resonance. The feedback means 34 in FIG. 3 comprise a band-pass filter 35 having a transfer function H(s). The pass-band of the filter 35 coincides with a resonance frequency of the resonant circuit of the virtual ground current block 32. The band-pass filter is a second-degree Butterworth filter in FIG. 3.

The feedback means 34 in FIG. 3 further comprise a second delay block 36, and a gain 37. The second delay block 36 produces a delay that causes the feedback signal to have a sufficient phase margin with respect to a subsequent period of the resonance frequency component. A value for the delay may be calculated on the basis of at least switching delays, phase shift characteristics of the output filter at the resonant frequency, and an A/D conversion delay, for example. The gain 37 may be determined on the basis of the modulation index of the power converter which may set limitations to the gain.

Figure 4:
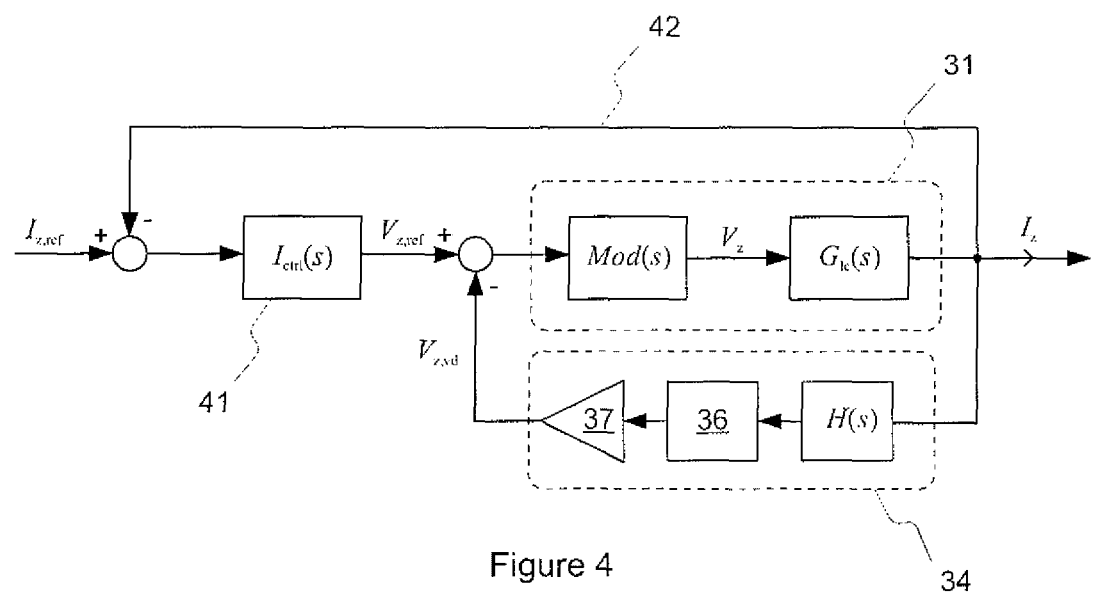
FIG. 4 shows the exemplary implementation of FIG. 3 as part of a common-mode control loop.

A feedback loop according to the present disclosure may be incorporated to a common-mode control loop. For example, the feedback loop may be added to a common-mode current control loop. FIG. 4 shows the exemplary implementation of FIG. 3 as part of a common-mode control loop. A controller 41 controls the common-mode current $I_z$ on the basis of a common-mode current reference $I_{z,ref}$ and a common-mode current feedback 42. The controller 41 produces a voltage reference $V_{z,ref}$ which is supplied to the power converter system 31 as a reference. A damping feedback signal $V_{z,vd}$ generated by the feedback means 34 is injected into the voltage reference $V_{z,ref}$.

The present disclosure further describes an arrangement for damping a resonant component of a common-mode current of a multi-phase power converter. The power converter comprises an output filter with a virtual ground connection to the power converter. The power converter may be an inverter or a frequency converter, for example. The output filter comprises at least one inductive and capacitive component forming a resonant circuit along the virtual ground connection. The common-mode current is controlled on the basis of a common-mode current reference.

The arrangement comprises means configured to carry out a method according to the present disclosure. The means may be configured to determine the common-mode current, form a feedback signal (representing a resonance frequency component of the common-mode current at a resonance frequency of the resonant circuit) on the basis of the common-mode current, and inject the feedback signal into the common-mode current reference in order to dampen the resonance frequency component. If the power converter is a frequency converter, the frequency converter may comprise the means configured to carry out the method, for example.

The means may be configured to form the feedback signal by filtering the determined common-mode current with a band-pass filter, and by adding a delay to the feedback signal. The band-pass filter may have its pass-band coinciding with the resonance frequency of the resonant circuit in order to determine the sinusoidal resonance frequency component of the common-mode current at the resonance frequency. The delay may be such that the determined resonance frequency component has a sufficient phase margin with respect to a subsequent cycle of the resonance frequency component of the common-mode current in order to form a stable control loop.

In the case of a frequency converter as the power converter, current sensors of the frequency converter measuring the phase currents may be utilised in calculating the common-mode current. The frequency converter may alternatively comprise a sensor in the virtual ground connection for directly measuring the common-mode current. Control circuitry of the frequency converter may be used for forming the feedback signal on the basis of the common-mode current. A band-pass filter of a method according to the present disclosure may be implemented as an analog or a digital filter on the frequency converter. The feedback signal may be injected into the common-mode current reference in a controller of the frequency converter, for example. A desired delay may be added to the feedback signal in the controller.

A method or arrangement according to the present disclosure is not limited to the above examples. For example, a method or arrangement according to the present disclosure may be applied not only to inverters or frequency converters but also to other means capable of actively conditioning a common-mode component of electrical power.

A method or arrangement according to the present disclosure is not limited to LC or LCL filters, but can be used to dampen a resonance of any filter forming a resonant circuit along the virtual ground connection. Further, the output filter does not have to be connected between the power converter and a grid. The filter may be formed between the power converter and an electric motor, for example.

The delay does not have to be added after filtering the common-mode current. A desired phase shift between a filtered resonance frequency component and a subsequent cycle of the sinusoidal resonance frequency component of the common-mode current may also be achieved by delaying the determined common-mode current, and by filtering the resonance frequency component from the delayed common-mode current.

The band-pass filter does not have to be a second-degree Butterworth filter. Any other suitable filter types, such as elliptic or Chebyshev filters, may be used. The filter degree is also not limited to second-degree filters.

Although the examples of the present disclosure show a method and apparatus according to the present disclosure implemented in a three-phase system, the method may also be used in systems with any plurality of phases, as long as the phases are filtered with a filter that forms a shared resonant circuit via a virtual ground connection and the common-mode current via the ground connection is controlled.

The fluctuations (variances) of the component values (within the tolerance ranges) may have an effect on the actual resonance frequency. The variance of the resonance is still relatively small, so one band-pass filter may be used for all variances of the component values (within the tolerance ranges). However, the band-pass parameter values may be adaptively selected. The resonance frequency may be determined by causing a pulse to the resonant circuit (by using the power converter) and by observing the emerging resonance.

The power converter does not have to be grid-connected. For example, a method according to the present disclosure may also be applied to motor-connected power converters (e.g. in an application where the power converter and the motor have long cables connecting them). Various parts (e.g. the band-pass filter, the feedback loop delay) of a method according to present disclosure may be implemented as a digital or an analog implementation.

It will be obvious to a person skilled in the art that the inventive concept can be implemented in various ways. The invention and its embodiments are not limited to the examples described above but may vary within the scope of the claims.

The invention claimed is:

1. A method for damping a resonant component of a common-mode current of a multi-phase power converter comprising an output filter with a virtual ground connection to the multi-phase power converter, wherein the output filter comprises at least one inductive component and at least one capacitive component that form a resonant circuit along the virtual ground connection, wherein the common-mode current is controlled on a basis of a common-mode current reference, and wherein the method comprises:
   determining the common-mode current,
   forming, on a basis of the common-mode current, a feedback signal representing a sinusoidal resonance frequency component of the common-mode current, and
   injecting the feedback signal into the common-mode current reference to dampen the sinusoidal resonance frequency component,
   wherein forming the feedback signal comprises:
   filtering the determined common-mode current with a band-pass filter having a pass-band that coincides with a resonance frequency of the resonant circuit in order to determine the sinusoidal resonance frequency component of the common-mode current at the resonance frequency, and
   adding a delay to the feedback signal, the delay being such that the determined sinusoidal resonance frequency component has a phase shift of essentially 360° with respect to the common-mode current in order to form a stable control loop.

2. The method according to claim 1, wherein a value for the delay added to the filtered resonance frequency component is calculated on a basis of at least a switching delay, phase shift characteristics of the output filter, and a delay induced by measurement.

3. The method according to claim 1, wherein the gain of the feedback signal is determined on a basis of a modulation index of the multi-phase power converter.

4. The method according to claim 1, wherein the common-mode current is determined from phase currents or measured directly from the virtual ground connection.

5. The method according to claim 1, wherein the output filter is a LC filter or a LCL filter.

6. The method according to claim 1, wherein the multi-phase power converter is a grid-connected converter.

7. The method according to claim 1, wherein the band-pass filter is a second-degree Butterworth filter.

8. An arrangement for damping a resonant component of a common-mode current of a multi-phase power converter comprising an output filter with a virtual ground connection to the multi-phase power converter, wherein the output filter comprises at least one inductive component and at least one capacitive component that form a resonant circuit along the virtual ground connection, wherein the common-mode current is controlled on the basis of a common-mode current reference, wherein the arrangement comprises means configured to carry out a method comprising:
   determining the common-mode current;
   forming, on a basis of the common-mode current, a feedback signal representing a sinusoidal resonance frequency component of the common-mode current; and
   injecting the feedback signal into the common-mode current reference to dampen the sinusoidal resonance frequency component;
   wherein forming the feedback signal comprises:
   filtering the determined common-mode current with a band-pass filter having a pass-band that coincides with a resonance frequency of the resonant circuit in order to determine the sinusoidal resonance frequency component of the common-mode current at the resonance frequency; and
   adding a delay to the feedback signal, the delay being such that the determined sinusoidal resonance frequency component has a phase shift of essentially 360° with respect to the common-mode current in order to form a stable control loop.

9. The method according to claim 2, wherein a gain of the feedback signal is determined on a basis of a modulation index of the multi-phase power converter.

10. The method according claim 2, wherein the common-mode current is determined from phase currents or measured directly from the virtual ground connection.

11. The method according claim 3, wherein the common-mode current is determined from phase currents or measured directly from the virtual ground connection.

12. The method according to claim 2, wherein the output filter is a LC filter or a LCL filter.

13. The method according to claim 3, wherein the output filter is a LC filter or a LCL filter.

14. The method according to claim 4, wherein the output filter is a LC filter or a LCL filter.

15. The method according to claim 2, wherein the multi-phase power converter is a grid-connected converter.

16. The method according to claim 3, wherein the multi-phase power converter is a grid-connected converter.

17. The method according to claim 4, wherein the multi-phase power converter is a grid-connected converter.

18. The method according to claim 2, wherein the band-pass filter is a second-degree Butterworth filter.

19. The method according to claim 3, wherein the band-pass filter is a second-degree Butterworth filter.

20. The method according to claim 4, wherein the band-pass filter is a second-degree Butterworth filter.

* * * * *